(12) United States Patent
Yoshioka et al.

(10) Patent No.: US 10,466,602 B2
(45) Date of Patent: Nov. 5, 2019

(54) PATTERNING METHOD, LITHOGRAPHY APPARATUS, AND ARTICLE MANUFACTURING METHOD

(71) Applicant: CANON KABUSHIKI KAISHA, Tokyo (JP)

(72) Inventors: Taichi Yoshioka, Utsunomiya (JP); Yusuke Kurita, Utsunomiya (JP); Tohru Suzuki, Utsunomiya (JP); Moritaka Iwakoshi, Kawasaki (JP); Taizou Kawada, Utsunomiya (JP); Hironori Okazumi, Tokyo (JP); Shunsuke Karaki, Minamitsuru-gun (JP); Takayuki Hashimoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/110,417

(22) Filed: Aug. 23, 2018

(65) Prior Publication Data

US 2019/0072864 A1     Mar. 7, 2019

(30) Foreign Application Priority Data

Sep. 4, 2017   (JP) ................................. 2017-169606

(51) Int. Cl.
*G03F 9/00* (2006.01)
*G03F 7/20* (2006.01)
(Continued)

(52) U.S. Cl.
CPC .............. *G03F 9/7088* (2013.01); *G03F 1/00* (2013.01); *G03F 1/42* (2013.01); *G03F 7/70141* (2013.01)

(58) Field of Classification Search
CPC ... G03F 7/70525; G03F 9/7003; G03F 9/7088
See application file for complete search history.

(56) References Cited

FOREIGN PATENT DOCUMENTS

CN    106716258 A    5/2017
JP    2001274073 A   10/2001
(Continued)

OTHER PUBLICATIONS

Office Action issued in Taiwanese Appln. No. 107128747 dated Apr. 12, 2019.

*Primary Examiner* — Steven Whitesell Gordon
(74) *Attorney, Agent, or Firm* — Rossi, Kimms & McDowell LLP

(57) ABSTRACT

A lithography apparatus detects a plurality of first substrate-side marks arranged with respect to a part of shot regions on which patterning is to be performed by using the first original in the lithography apparatus and detects a plurality of second substrate-side marks arranged with respect to other shot regions different from the part of the shot regions on which patterning is to be performed by using the second original different from the first original in another lithography apparatus. The lithography apparatus outputs information on detection results of the plurality of second substrate-side marks to be available in the other lithography apparatus. Then, based on detection results of the plurality of first substrate-side marks, the lithography apparatus performs patterning while performing alignment with the first original with respect to the part of the shot regions.

11 Claims, 9 Drawing Sheets

(51) Int. Cl.
*G03F 1/00* (2012.01)
*G03F 1/42* (2012.01)

(56) References Cited

FOREIGN PATENT DOCUMENTS

| TW | 201502698 A | 1/2015 | | |
|---|---|---|---|---|
| TW | 201730683 A | 9/2017 | | |
| WO | WO-2016051690 A1 | * | 4/2016 | ........... G03F 7/0002 |

* cited by examiner

PATTERNING METHOD, LITHOGRAPHY APPARATUS, AND ARTICLE MANUFACTURING METHOD

BACKGROUND OF THE INVENTION

Field of the Invention

The present invention relates to a patterning method, a lithography apparatus, and an article manufacturing method.

Description of the Related Art

In a lithography process of manufacturing an electronic device such as a liquid crystal display, a step-and-scan type scanning projection exposure apparatus is used, which performs exposure while relatively scanning an original such as a mask and a substrate such as a glass plate with respect to a projection optical system in synchronism with each other.

In recent years, the size of a substrate increases particularly in a liquid crystal display device. In order to use the substrate without wasting anything, a plurality of devices of different sizes are manufactured in one substrate. On the other hand, the size of an exposure region also increases, making it difficult to form a plurality of patterns of different sizes in one original. Accordingly, the devices are manufactured by using a plurality of originals with respect to one substrate. In order to improve throughput, however, different original patterns are transferred to one substrate by using a plurality of exposure apparatuses.

As a technique of improving the throughput of an exposure apparatus, there is proposed a method of preparing a mark measuring machine independent of the exposure apparatus, performing measurement in advance by using an external measuring machine before measurement by the exposure apparatus, and omitting a measurement step of the exposure apparatus (see Japanese Patent Laid-Open No. 2001-274073).

In a manufacturing line that transfers patterns to one substrate by using a plurality of exposure apparatuses, layouts in which the patterns are transferred by the plurality of exposure apparatuses are different. This makes a difference in throughput between the respective apparatuses, and the productivity of the manufacturing line is rate-determined by an apparatus having the slowest processing speed. It is therefore necessary to improve the throughput of the apparatus having the slowest processing speed in order to improve the productivity of the manufacturing line.

In the technique described in Japanese Patent Laid-Open No. 2001-274073, it becomes possible to improve the throughput of the exposure apparatus by shortening a mark measurement time. However, another measuring machine becomes necessary in addition to the exposure apparatus, increasing an installation area (footprint).

SUMMARY OF THE INVENTION

The present invention provides, for example, a patterning method advantageous in both a decrease in footprint and an increase in throughput.

The present invention in its one aspect provides a patterning method of performing patterning for forming a pattern of an original on a substrate by using a lithography apparatus, the method comprising performing a first process for detecting a plurality of first substrate-side marks arranged with respect to, out of a plurality of shot regions of the substrate, a part of shot regions on which the patterning is to be performed by using a first original in the lithography apparatus, performing a second process for detecting a plurality of second substrate-side marks arranged with respect to, out of the plurality of shot regions, other shot regions different from the part of the shot regions on which the patterning is to be performed by using a second original different from the first original in another lithography apparatus, performing a third process for outputting information on detection results of the plurality of second substrate-side marks to be available in the other lithography apparatus, and performing a fourth process for performing the patterning while performing alignment with the first original with respect to the part of the shot regions, based on detection results of the plurality of first substrate-side marks.

Further features of the present invention will become apparent from the following description of exemplary embodiments (with reference to the attached drawings).

DESCRIPTION OF THE EMBODIMENTS

Various exemplary embodiments, features, and aspects of the invention will be described in detail below with reference to the drawings.

Embodiments of the present invention will be described in detail below with reference to the accompanying drawings. Note that the following embodiments are merely specific examples of the embodiments of the present invention, and do not limit the present invention. In addition, not all combinations of characteristic features described in the following embodiments are essential to the solution of the problem in the present invention.

Figure 1:
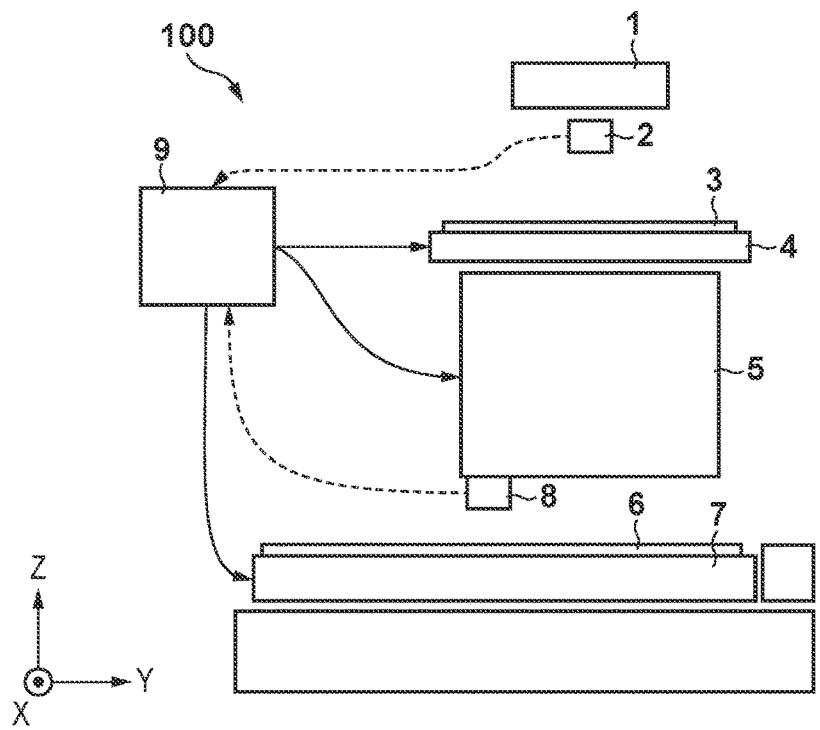
FIG. 1 is a view showing the arrangement of an exposure apparatus according to an embodiment.

The present invention is related to a lithography apparatus that forms a pattern on a substrate. The lithography apparatus includes an exposure apparatus that transfers a pattern of an original to the substrate via a projection optical system, an imprint apparatus that performs patterning on an imprint material on the substrate by using a mold, or the like. In an embodiment below, the exposure apparatus will be described as an example of the lithography apparatus. However, the present invention is applicable to the exposure apparatus and the imprint apparatus. FIG. 1 is a view showing the schematic arrangement of an exposure apparatus as an example of the lithography apparatus according to this embodiment.

In FIG. 1, an exposure apparatus 100 is a step-and-scan type exposure apparatus that transfers a pattern of an original 3 to each of a plurality of shot regions on a substrate 6 via a projection optical system 5. The exposure apparatus 100 can include, for example, an illumination optical system 1, an alignment detector 2, an original stage 4, the projection optical system 5, an off-axis detector 8, a substrate stage 7, and a controller 9. The controller 9 includes, for example, a CPU and a memory, and controls respective units of the exposure apparatus 100.

Light emitted from a light source (not shown) enters the illumination optical system 1 and forms, for example, an arcuate exposure region on the original 3 (for example, a mask). The original 3 and the substrate 6 (for example, a glass plate) are respectively held on the original stage 4 and substrate stage 7, and arranged in almost optically conjugate positions (an object plane and image plane of the projection optical system 5) via the projection optical system 5. The projection optical system 5 is, for example, a mirror projection type projection optical system formed by a plurality of mirrors, has a predetermined projection magnification (for example, a magnification of 1 or ½), and projects patterns formed on the original 3 onto the substrate 6. The original stage 4 and the substrate stage 7 scan the original and the substrate at a speed ratio corresponding to the projection magnification of the projection optical system 5 in synchronism with each other in a direction perpendicular to an optical axis direction (Z direction) of the projection optical system 5. Accordingly, the patterns formed on the original 3 can be transferred to the shot regions on the substrate 6. Then, exposure processing on one substrate 6 can be completed by sequentially repeating such scan exposure for each of the plurality of shot regions on the substrate 6 while moving the substrate stage 7 stepwise.

When transferring the pattern of the original 3 to each shot region on the substrate 6, alignment between the shot region and a region of the original 3 where the pattern has been formed is performed. The exposure apparatus 100 of this embodiment detects a plurality of measurement marks provided in each shot region by using both the alignment detector 2 and the off-axis detector 8. The alignment detector 2 simultaneously observes the measurement marks of the original 3 and the measurement marks of the substrate 6 via the original 3 and projection optical system 5. The off-axis detector 8 directly observes the measurement marks of the substrate 6 without going through the original 3. Then, the controller 9 calculates a correction amount for each shot by using results detected by the alignment detector 2 and off-axis detector 8. Furthermore, the controller 9 calculates a driving amount of the substrate stage 7 and a driving amount of an optical element in the projection optical system 5 at the time of scan exposure from the calculated correction amount for each shot, and performs exposure while controlling the substrate stage 7 and the projection optical system 5 at the time of scan exposure.

Figure 2:
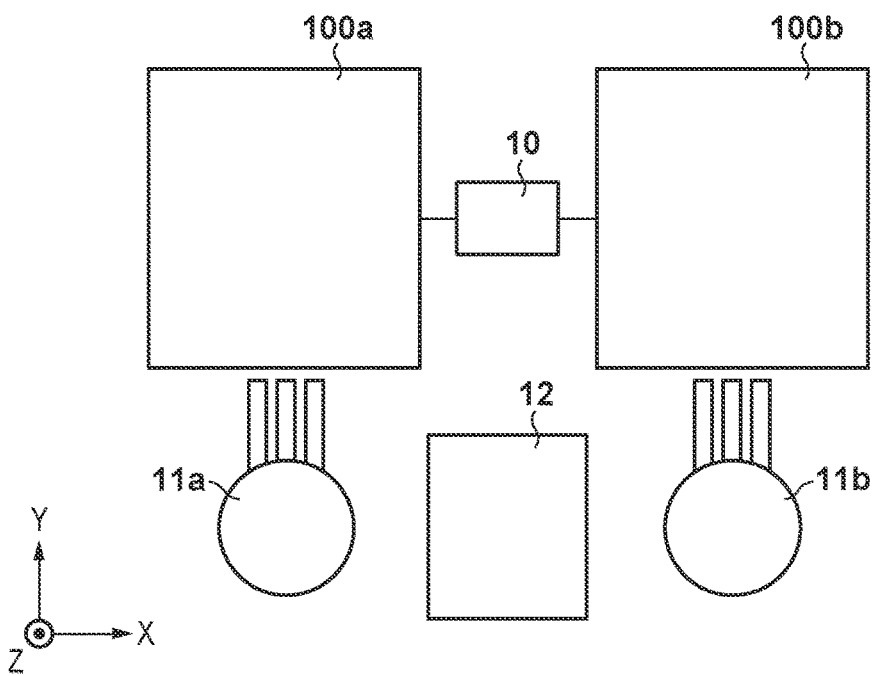
FIG. 2 is a view showing the arrangement of a manufacturing line according to the embodiment.

A manufacturing line (lithography system) in this embodiment will be described next. This manufacturing line sequentially transfers patterns of a plurality of originals to different positions on one substrate 6 by using a plurality of exposure apparatuses (a plurality of lithography apparatuses). FIG. 2 is a schematic view showing the arrangement of the manufacturing line in this embodiment. In FIG. 2, the manufacturing line can include, for example, two adjacent apparatuses each having the same arrangement as the exposure apparatus 100 shown in FIG. 1, namely, a first exposure apparatus 100a (first lithography apparatus) and a second exposure apparatus 100b (second lithography apparatus). The manufacturing line can also include a first conveying device 11a and a second conveying device 11b that convey the substrate, and a substrate stocker 12 that can stock one, or two or more substrates. The first conveying device 11a conveys the substrate between the substrate stocker 12 and the first exposure apparatus 100a. The second conveying device 11b conveys the substrate between the substrate stocker 12 and the second exposure apparatus 100b. The manufacturing line can further include a buffer device 10. The buffer device 10 includes, for example, an HDD or an SSD, is connected to the controllers 9 of the first exposure apparatus 100a and second exposure apparatus 100b, and stores various kinds of data of the first exposure apparatus 100a and second exposure apparatus 100b. In FIG. 2, the buffer device 10 is shown as an independent device between the first exposure apparatus 100a and the second exposure apparatus 100b. However, the function of the buffer device 10 may be implemented by a storage device in the controller 9 of the first exposure apparatus 100a or second exposure apparatus 100b. Alternatively, the function of the buffer device 10 may be implemented by a comprehensive controller (not shown) that comprehensively controls an operation of the manufacturing line, an external server apparatus connected to the first exposure apparatus 100a and second exposure apparatus 100b via a network, or the like.

The first conveying device 11a is located in front of an interface opening portion of the first exposure apparatus 100a and loads the substrate 6 to the substrate stage 7 of the first exposure apparatus 100a. In addition, the first conveying device 11a unloads the substrate 6 processed by the first exposure apparatus 100a from the substrate stage 7 of the first exposure apparatus 100a and stocks it in the substrate stocker 12. The second conveying device 11b extracts the substrate 6 from the substrate stocker 12, loads the substrate 6 to the substrate stage 7 of the second exposure apparatus 100b, and unloads the substrate 6 processed by the second exposure apparatus 100b from the substrate stage 7 of the second exposure apparatus 100b.

Figure 3:
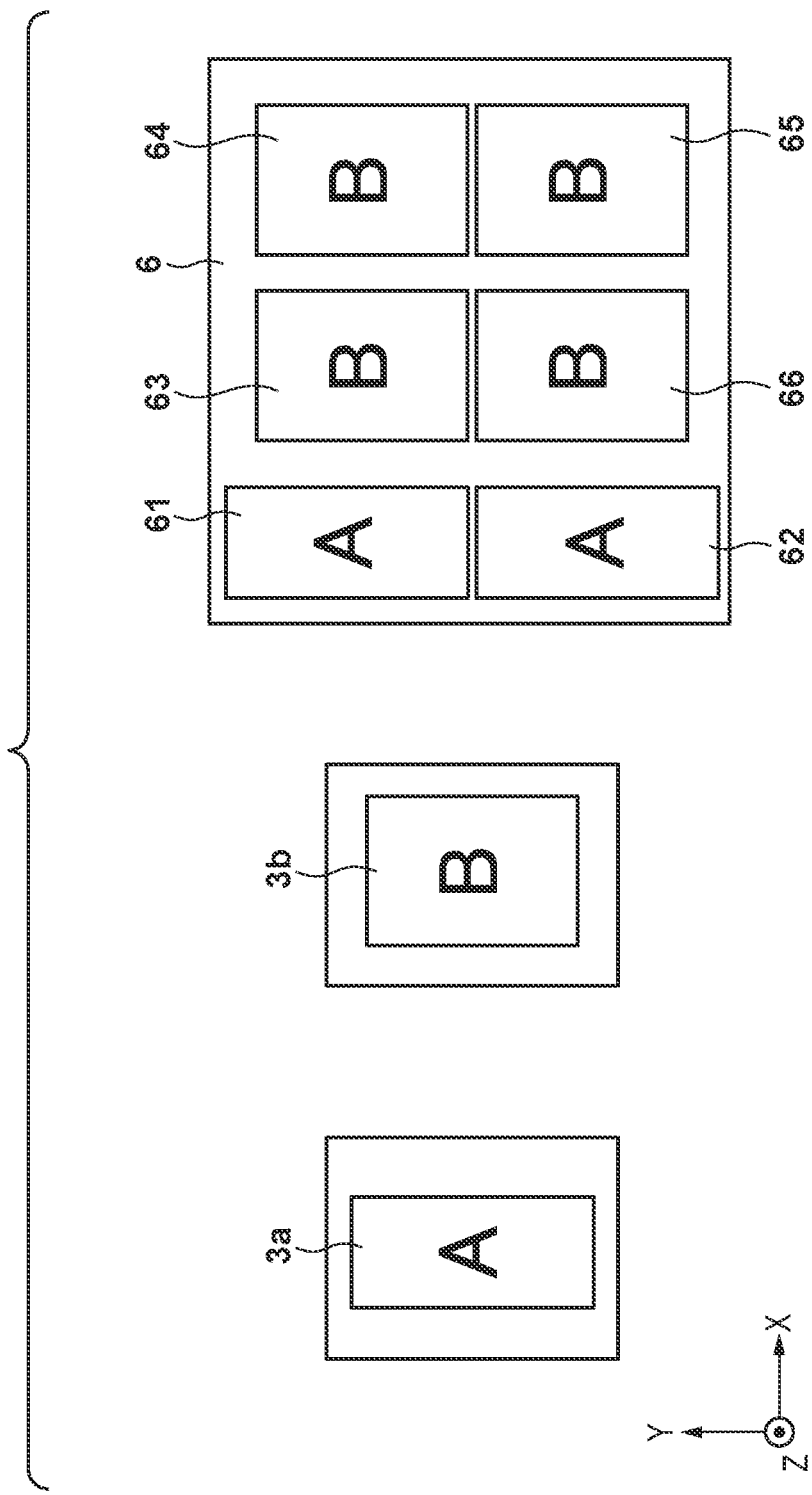
FIG. 3 shows views of an example of the layout of originals and a substrate in a manufacturing process according to the embodiment.

FIG. 3 is a schematic view showing the layout of the original 3 and substrate 6 in a manufacturing process according to this embodiment. The first exposure apparatus 100a sequentially transfers a pattern A of a first original 3a to each of a plurality of specific shot regions 61 and 62 on the substrate 6. Next, the second exposure apparatus 100b sequentially transfers a pattern B of a second original 3b to each of a plurality of specific shot regions 63, 64, 65, and 66 different from shot regions on the substrate 6 exposed by the first exposure apparatus 100a.

<Exposure Processing by First Exposure Apparatus>

Figure 4:
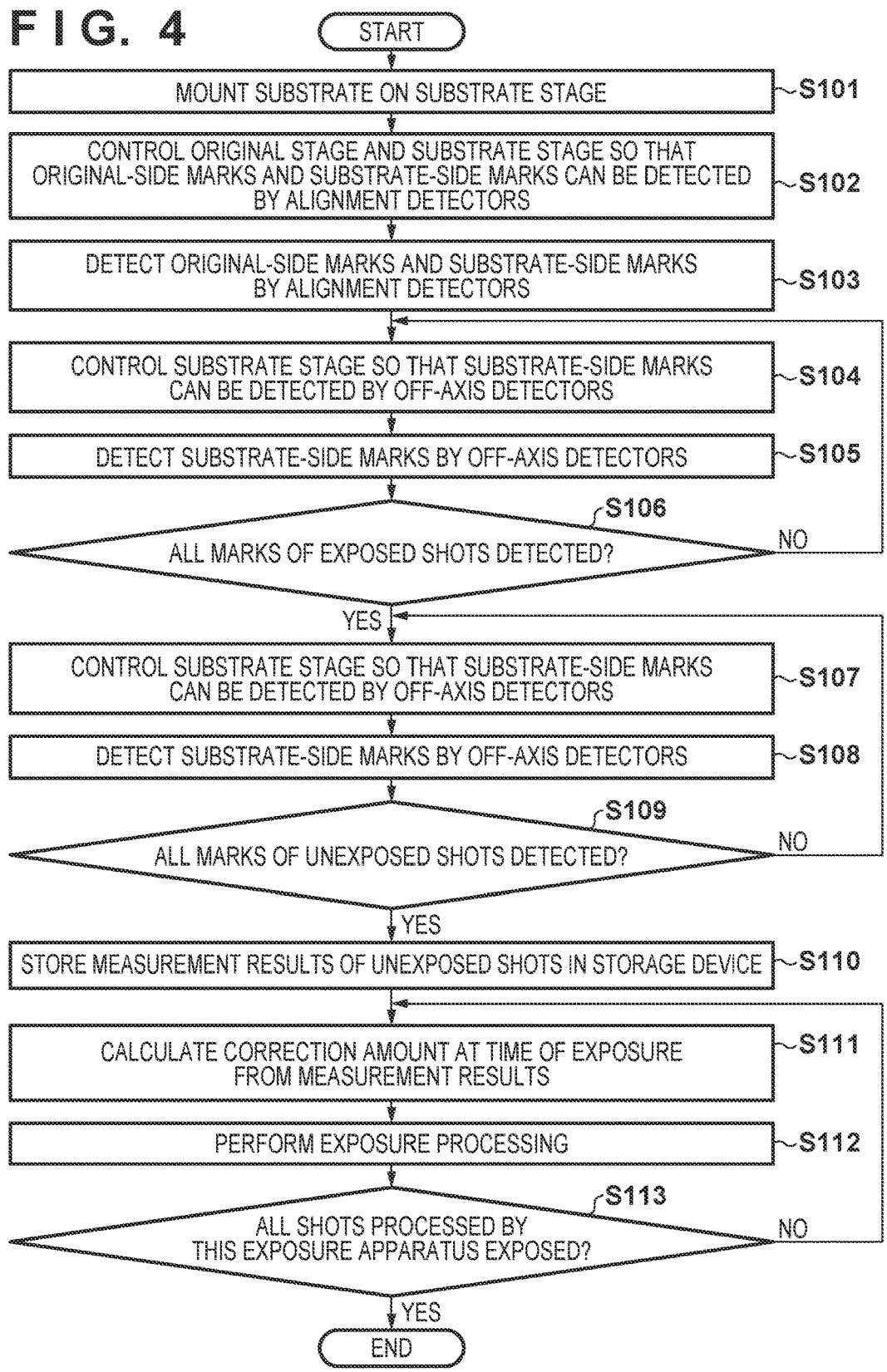
FIG. 4 is a flowchart showing an exposure method by the first exposure apparatus.
Figure 5:
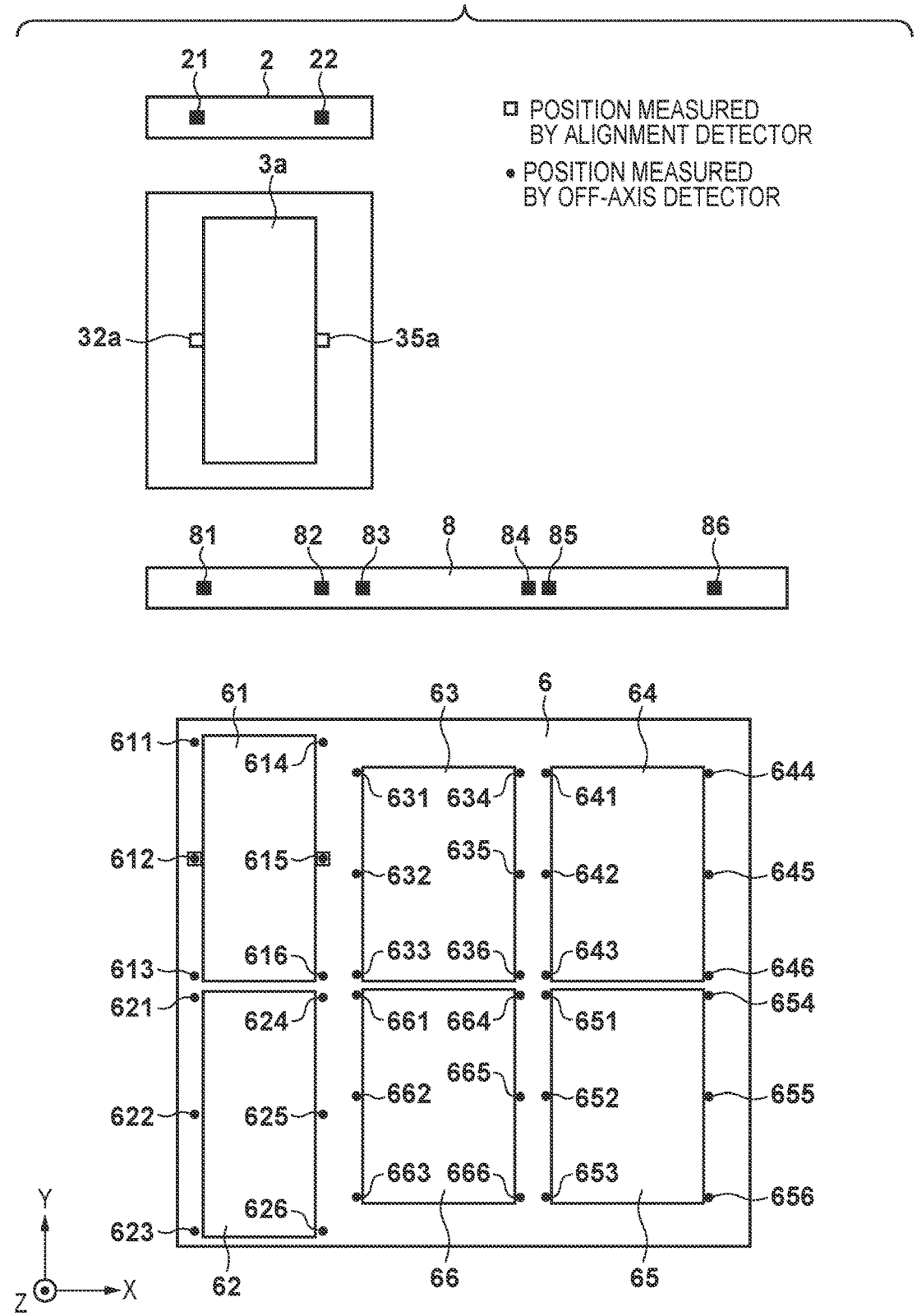
FIG. 5 shows views of examples of the arrangements of an alignment detector and an off-axis detector, and measurement marks arranged on the original and substrate.

Exposure processing by the first exposure apparatus 100a will be described below with reference to FIGS. 4 and 5. FIG. 4 is a flowchart showing an exposure method by the first exposure apparatus 100a. FIG. 5 shows views of examples of the arrangements of the alignment detector 2 and off-axis detector 8 in the first exposure apparatus 100a, and measurement marks arranged on the first original 3a and substrate 6. In FIG. 5, a pair of measurement marks 32a and 35a (to be referred to as "original-side marks" hereinafter) are arranged on the first original 3a so as to sandwich a pattern portion in an X direction. Corresponding to this, the alignment detector 2 includes alignment detectors 21 and 22 of two systems that detect the pair of original-side marks 32a and 35a. The plurality of shot regions of the substrate 6 include some shot regions (a part of shot regions) 61 and 62 on which patterning is to be performed by using the first original 3a in the first exposure apparatus 100a. Concerning some of these shot regions 61 and 62, a plurality of measurement marks (first substrate-side marks) denoted by reference numerals 611 to 626 are arranged on the substrate 6. The plurality of shot regions of the substrate 6 also include some shot regions 63, 64, 65, and 66 on which patterning is to be performed by using the second original 3b in the second exposure apparatus 100b. Concerning these shot regions 63 to 66, a plurality of measurement marks (second substrate-side marks) denoted by reference numerals 631 to 656 are arranged on the substrate 6. Corresponding to this, the off-axis detector 8 includes off-axis detectors 81, 82, 83, 84, 85, and 86 of six systems that detect the substrate-side marks 611 to 656.

In step S101, the controller 9 of the first exposure apparatus 100a controls the first conveying device 11a to mount the substrate 6 on the substrate stage 7.

In step S102, the controller 9 controls the substrate stage 7 and the original stage 4 so that the original-side marks 32a and 35a, and the substrate-side marks 612 and 615 of the shot region 61 are detected by the alignment detectors 21 and 22.

In step S103, the controller 9 causes the alignment detectors 21 and 22 to detect the marks, and obtains the positions of the first substrate-side marks 612 and 615 (reference marks) with respect to the first original 3a. Let $(Ax_{612}, Ay_{612})$ and $(Ax_{615}, Ay_{615})$ be results.

In step S104, the controller 9 controls the substrate stage 7 so that substrate-side marks (for example, the first substrate-side marks 611 and 614) to be measured are detected by the off-axis detectors 81 and 82 shown in FIG. 5.

In step S105, the controller 9 causes the off-axis detectors 81 and 82 to measure the substrate-side marks, and obtains the positions of the substrate-side marks. Results are represented by $(Ox_{6ij}, Oy_{6ij})$ (i=1 to 2, and j=1 to 6).

In step S106, the controller 9 determines whether all marks of the shot regions 61 and 62 processed by the first exposure apparatus 100a have been measured. If measurement has not ended, measurement operations in steps S104 and S105 are repeated for unmeasured marks. If measurement of all the marks has ended, the process advances to step S107. Thus, in steps S104 to S106, the first process of detecting a plurality of first substrate-side marks arranged with respect to some shot regions on which patterning is to be performed by using the first original 3a in the first exposure apparatus 100a is executed.

In step S107, the controller 9 controls the substrate stage 7 so that substrate-side marks (for example, the substrate-side marks 631, 634, 641, and 644) to be measured are detected by the off-axis detectors 83, 84, 85, and 86.

In step S108, the controller 9 causes the off-axis detectors 83, 84, 85, and 86 to measure the substrate-side marks, and obtains the positions of the substrate-side marks. The results are represented by $(Ox_{6ij}, Oy_{6ij})$ (i=3 to 6, and j=1 to 6).

In step S109, the controller 9 determines whether all marks of the shot regions 63, 64, 65, and 66 on which exposure processing is not performed in the first exposure apparatus 100a have been measured. If measurement has not ended, measurement operations in steps S107 and S108 are repeated for unmeasured marks. If measurement of all the marks has ended, the process advances to step S110. Thus, in steps S107 to S109, the second process of detecting a plurality of second substrate-side marks arranged with respect to other shot regions different from shot regions on which patterning is to be performed by using the second original 3b in the second exposure apparatus 100b is executed.

In step S110, the third process of outputting information on detection results of the second substrate-side marks obtained in step S108 to be available in the second exposure apparatus 100b serving as another lithography apparatus is executed. For example, the controller 9 stores results measured in step S108 in the buffer device 10.

In step S111, the controller 9 calculates a correction amount at the time of exposure. The correction amount is calculated as follows. For example, based on measurement results by the alignment detectors in step S103 and the measurement results by the off-axis detectors in step S105, the controller 9 obtains the positions of the substrate-side marks with respect to the first original 3a. Letting $(x_{6ij}, y_{6ij})$ be positions of the substrate-side marks with respect to the first original 3a, the positions of the substrate-side marks with respect to the first original 3a are obtained by:

when j≤3, $$(x_{6ij}, y_{6ij}) = (Ox_{6ij} + Ax_{612} - Ox_{612}, Oy_{6ij} + Ay_{612} - Oy_{612}) \qquad (1)$$

when j>3, $$(x_{6ij}, y_{6ij}) = (Ox_{6ij} + Ax_{615} - Ox_{615}, Oy_{6ij} + Ay_{615} - Oy_{615}) \qquad (2)$$

Figure 6:
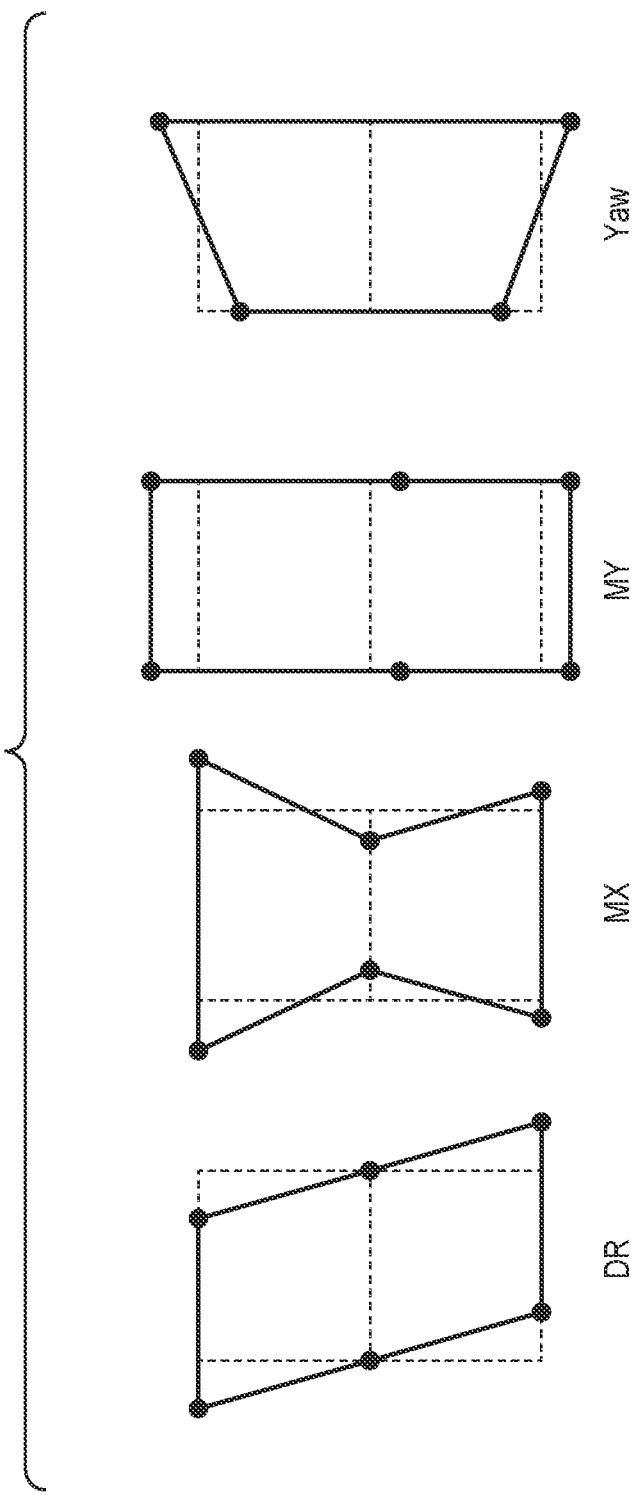
FIG. 6 shows views showing shot correction components.

Based on values obtained by equations (1) and (2), shot correction components shown in FIG. 6 are obtained by:

$$DR1 = (x_{6i1} - x_{6i4})/2 \qquad (3)$$

$$DR2 = (x_{6i2} - x_{6i5})/2 \qquad (4)$$

$$DR3 = (x_{6i3} - x_{6i6})/2 \qquad (5)$$

$$MX1 = (x_{6i1} - x_{6i4}) \qquad (6)$$

$$MX2 = (x_{6i2} - x_{6i5}) \qquad (7)$$

$$MX3 = (x_{6i3} - x_{6i6}) \qquad (8)$$

$$MY1 = (y_{6i1} - y_{6i4})/2 \qquad (9)$$

$$MY2 = (y_{6i2} - y_{6i5})/2 \qquad (10)$$

$$MY3 = (y_{6i3} - y_{6i6})/2 \qquad (11)$$

$$\text{Yaw1} = (y_{6i1} - y_{6i4}) \qquad (12)$$

$$\text{Yaw2} = (y_{6i2} - y_{6i5}) \qquad (13)$$

$$\text{Yaw3} = (y_{6i3} - y_{6i6}) \qquad (14)$$

Based on values obtained by equations (3) to (14), a driving amount of the substrate stage 7 at the time of exposure is calculated. Letting $Y_s$ be a position when the substrate stage 7 performs scan exposure in a Y direction, driving amounts $(X_{comp}, Y_{comp}, \theta_{comp})$ of the substrate stage 7 are obtained by:

when $Y_s \geq Y_{6i2}$, $$X_{comp} = (((DR1 - DR2)/(Y_{6i1} - Y_{6i2})) \cdot (Y_s - Y_{6i2})) + DR2 \qquad (15)$$

$$Y_{comp} = (((MY1 - MY2)/(Y_{6i1} - Y_{6i2})) \cdot (Y_s - Y_{6i2})) + MY2 \qquad (16)$$

$$\theta comp = (((\text{Yaw1} - \text{Yaw2})/(Y_{6i1} - Y_{6i2})) \cdot (Y_s - Y_{6i2})) + \text{Yaw2} \qquad (17)$$

when $Y_s < Y_{6i2}$, $$X_{comp} = (((DR3 - DR2)/(Y_{6i3} - Y_{6i2})) \cdot (Y_s - Y_{6i2})) + DR2 \qquad (18)$$

$$Y_{comp}=(((MY3-MY2)/(Y_{6i3}-Y_{6i2}))\cdot(Y_s-Y_{6i2}))+MY2 \quad (19)$$

$$\theta_{comp}=(((Yaw3-Yaw2)/(Y_{6i3}-Y_{6i2}))\cdot(Y_s-Y_{6i2}))+Yaw2 \quad (20)$$

Based on the values obtained by equations (3) to (14), the driving amount of the optical element in the projection optical system is calculated. Letting $Y_s$ be the position when the substrate stage 7 scans the substrate in the Y direction, a driving amount $O_{comp}$ of the optical element is obtained by:

when $Y_s \geq Y_{6i2}$, $$O_{comp}=(((MX1-MX2)/(Y_{6i1}-Y_{6i2}))\cdot(Y_s-Y_{6i2}))+MX2 \quad (21)$$

when $Y_s < Y_{6i2}$, $$O_{comp}=(((MX3-MX2)/(Y_{6i3}-Y_{6i2}))\cdot(Y_s-Y_{6i2}))+MX2 \quad (22)$$

In step S112, based on the driving amounts ($X_{comp}$, $Y_{comp}$, $\theta_{comp}$) of the substrate stage 7 and the driving amount $O_{comp}$ of the optical element obtained in step S111, the controller 9 performs scan exposure by synchronizing the original stage 4 and the substrate stage 7 with each other.

In step S113, the controller 9 confirms whether all the shot regions 61 and 62 to be processed by the first exposure apparatus 100a have been exposed. If there is an unexposed shot, the controller 9 performs steps S111 and S112 repeatedly for the unexposed shot. Thus, the fourth process of performing exposure processing (patterning) while performing alignment with the first original 3a with respect to the shot regions 61 and 62 is executed based on detection results of the first substrate-side marks in steps S111 to S113. When exposure processing thus ends for the substrate 6, the controller 9 controls the first conveying device 11a to unload the processed substrate 6 from the substrate stage 7 and stock it in the substrate stocker 12.

As described above, according to this embodiment, the first exposure apparatus 100a measures the marks of the shot regions processed by the first exposure apparatus 100a and measures, in advance, marks of shot regions which are not processed by the first exposure apparatus 100a. The shot regions which are not processed by the first exposure apparatus 100a are, for example, shot regions to be processed by the second exposure apparatus 100b, and the first exposure apparatus 100a covers mark measurement in the shot regions of the second exposure apparatus 100b. This makes it possible to advance a part of a process of an exposure apparatus to be processed later in a manufacturing process by using a plurality of exposure apparatuses and to improve the throughput of the exposure apparatus to be processed later.

In the above-described embodiment, the first process (steps S104 to S106) of measuring the substrate-side marks of the shot regions 61 and 62 processed by the first exposure apparatus 100a is executed. Subsequently, the second process (steps S107 to S109) of measuring the substrate-side marks of the shot regions 63 to 66 which are not processed by the first exposure apparatus 100a is executed. However, an execution order of the first process and second process may be interchanged. For example, the second process may be executed first, and then the first process may be executed. Alternatively, the first process and the second process may be executed, for example, in an order in which the driving amounts of the substrate stage 7 are minimized. The substrate-side marks of the shot regions 61 and 62 processed by the first exposure apparatus 100a, and the substrate-side marks of the shot regions 63 to 66 which are not processed by the first exposure apparatus 100a may be detected simultaneously if the off-axis detector 8 can detect them simultaneously.

In this embodiment, all the substrate-side marks of the shot regions 63 to 66 which are not processed by the first exposure apparatus 100a are measured in steps S107 to S109. However, all the marks need not always be measured, and only some of the substrate-side marks may be measured.

<Exposure Processing by Second Exposure Apparatus>

Figure 7:
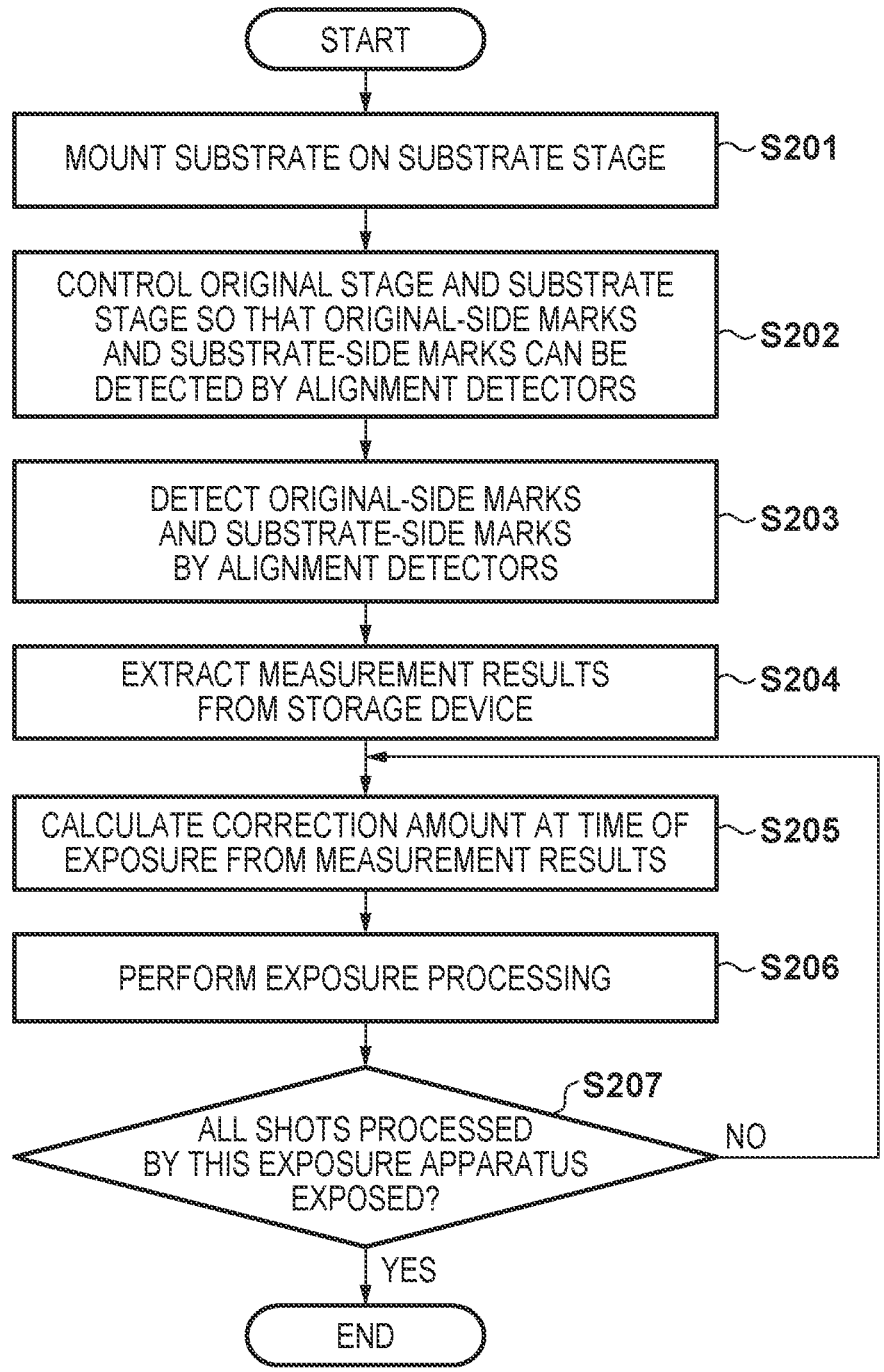
FIG. 7 is a flowchart showing an exposure method by the second exposure apparatus.
Figure 8:
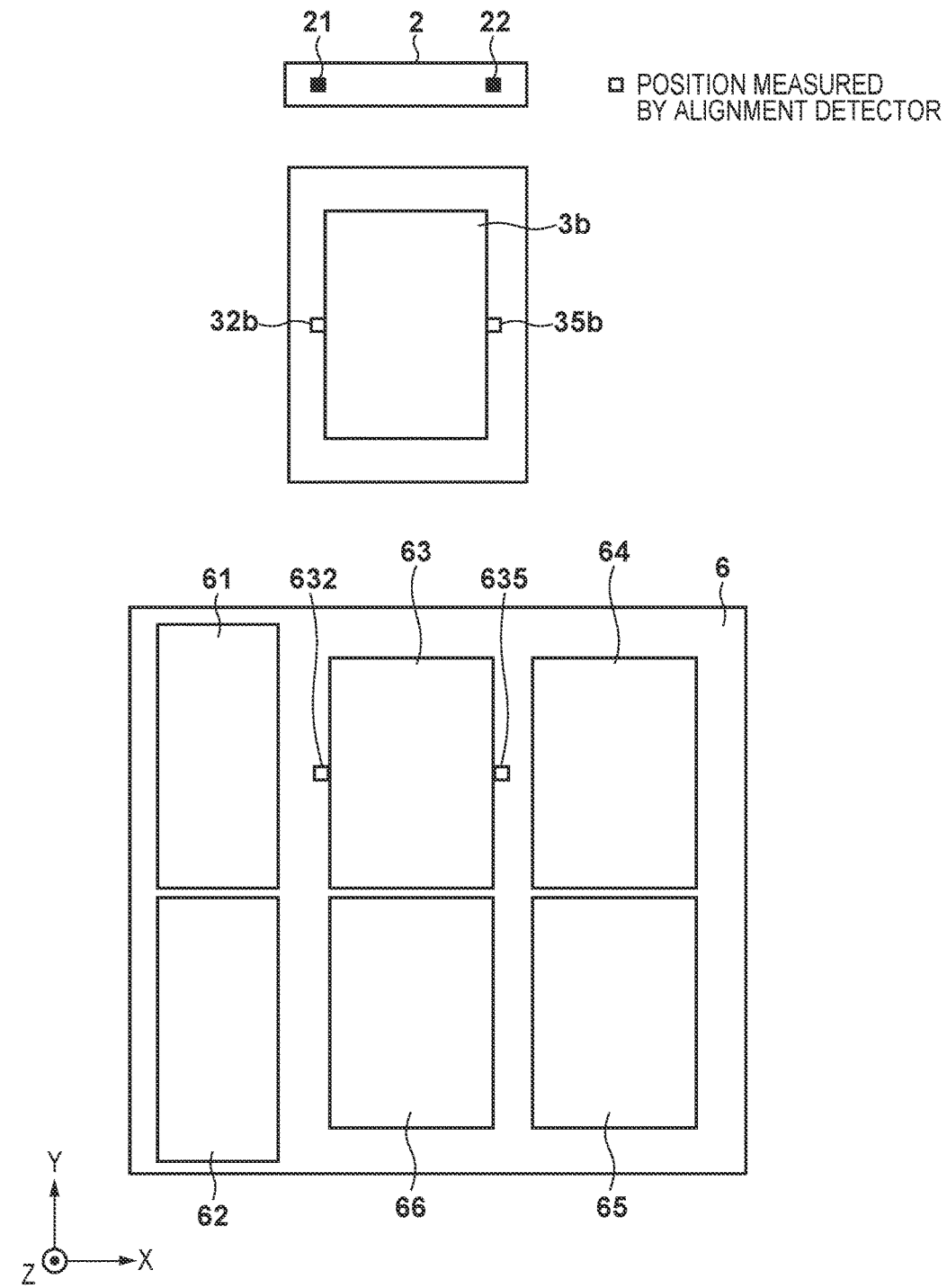
FIG. 8 shows views of examples of the alignment detector of the second exposure apparatus, and measurement marks arranged on the original and substrate.

Exposure processing in the second exposure apparatus 100b will be described next with reference to FIGS. 7 and 8. FIG. 7 is a flowchart showing an exposure method by the second exposure apparatus 100b. FIG. 8 shows views of examples of the arrangement of the alignment detector 2 in the second exposure apparatus 100b, and measurement marks arranged on the second original 3b and substrate 6. As shown in FIG. 8, a pair of measurement marks 32b and 35b (original-side marks) are arranged on the second original 3b so as to sandwich a pattern portion in the X direction. Corresponding to this, the alignment detector 2 includes the alignment detectors 21 and 22 of two systems that detect the original-side marks 32b and 35b. The plurality of same substrate-side marks as shown in FIG. 5 can be arranged on the substrate 6. However, the substrate-side marks 632 and 635 of the shot region 63 as shown in FIG. 8 in particular are used here.

In step S201, the controller 9 of the second exposure apparatus 100b controls the second conveying device 11b to extract the substrate 6 processed by the first exposure apparatus 100a from the substrate stocker 12, load the substrate 6 to the substrate stage 7 of the second exposure apparatus 100b, and mount the substrate 6 on the substrate stage 7.

In step S202, the controller 9 controls the substrate stage 7 and the original stage 4 so that the substrate-side marks 632 and 635 of the shot region 63, and the original-side marks 32b and 35b to be measured are detected by the alignment detectors 21 and 22.

In step S203, the controller 9 causes the alignment detectors 21 and 22 to detect the marks, and obtains the positions of the substrate-side marks 632 and 635 with respect to the second original 3b. Let ($Ax_{632}$, $Ay_{632}$) and ($Ax_{635}$, $Ay_{635}$) be results.

In step S204, the controller 9 reads out results measured by the first exposure apparatus 100a (measurement results stored in step S110) from the buffer device 10. Let ($Ox_{6ij}$, $Oy_{6ij}$) (i=3 to 6, and j=1 to 6) be the readout results.

In step S205, the controller 9 calculates a correction amount at the time of exposure. The correction amount is calculated as follows. For example, based on measurement results of the substrate-side marks 632 and 635 shown in FIG. 8 in step S203, and the measurement results read out in step S204, the controller 9 obtains the positions of the substrate-side marks with respect to the second original 3b. Letting ($x_{6ij}$, $y_{6ij}$) be the positions of the substrate-side marks with respect to the second original 3b, the positions of the substrate-side marks with respect to the second original 3b are obtained by:

when j≤3, $$(x_{6ij}, y_{6ij})=(Ox_{6ij}+Ax_{632}-Ox_{632}, Oy_{6ij}+Ay_{632}-Oy_{632}) \quad (23)$$

when j>3, $$(x_{6ij}, y_{6ij})=(Ox_{6ij}+Ax_{635}-Ox_{635}, Oy_{6ij}+Ay_{635}-Oy_{635}) \quad (24)$$

Based on values obtained by equations (23) and (24), the controller 9 obtains shot correction components shown in FIG. 6. The subsequent calculation is performed in the same manner as equations (3) to (22) in step S111, obtaining the driving amounts ($X_{comp}$, $Y_{comp}$, $\theta_{comp}$) of the substrate stage 7 and the driving amount $O_{comp}$ of the optical element.

In step S206, based on the driving amounts ($X_{comp}$, $Y_{comp}$, $\theta_{comp}$) of the substrate stage 7 and the driving amount $O_{comp}$ of the optical element obtained in step S205, the controller 9 performs scan exposure by synchronizing the original stage 4 and the substrate stage 7 with each other.

In step S207, the controller 9 confirms whether all the shot regions 63, 64, 65, and 66 to be processed by the second exposure apparatus 100b have been exposed. If there is an unexposed shot, the controller 9 performs steps S205 and S206 repeatedly for the unexposed shot.

As described above, according to this embodiment, the second exposure apparatus 100b performs alignment of the shot regions processed by the second exposure apparatus 100b by using a result of measuring, in advance, the marks of the shot regions processed by the second exposure apparatus 100b in the first exposure apparatus 100a. The second exposure apparatus 100b, for example, measures only the substrate-side marks 632 and 635 as reference marks by using the alignment detector 2, and obtains the positions of other substrate-side marks by correcting them with reference to measurement results of the reference marks. By thus partially omitting mark measurement, it is possible to improve the throughput of the second exposure apparatus 100b in the manufacturing process by using the plurality of exposure apparatuses. In addition, a dedicated measurement station need not be provided. It is therefore possible to implement both a decrease in footprint and an increase in throughput.

Note that in this embodiment, since the first exposure apparatus 100a and the second exposure apparatus 100b are exposure apparatuses having the same arrangement, their functions are interchangeable. Out of the plurality of exposure apparatuses, a specific exposure apparatus that functions as the first exposure apparatus 100a and a specific exposure apparatus that functions as the second exposure apparatus 100b are designated, for example, in an exposure recipe managed by the controller 9.

<Modification of Exposure Processing by Second Exposure Apparatus>

Figure 9:
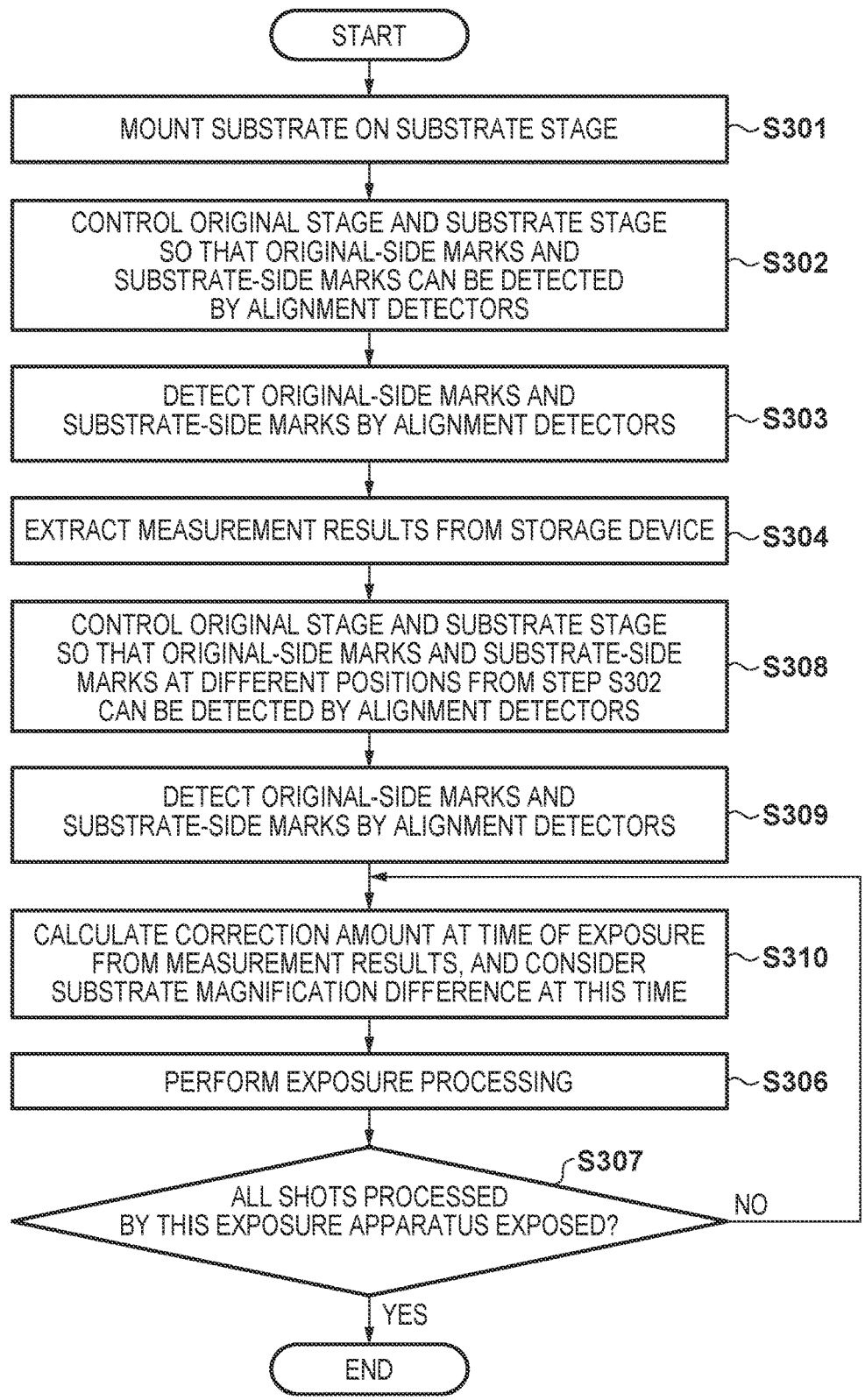
FIG. 9 is a flowchart showing an exposure method by the second exposure apparatus according to a modification.
Figure 10:
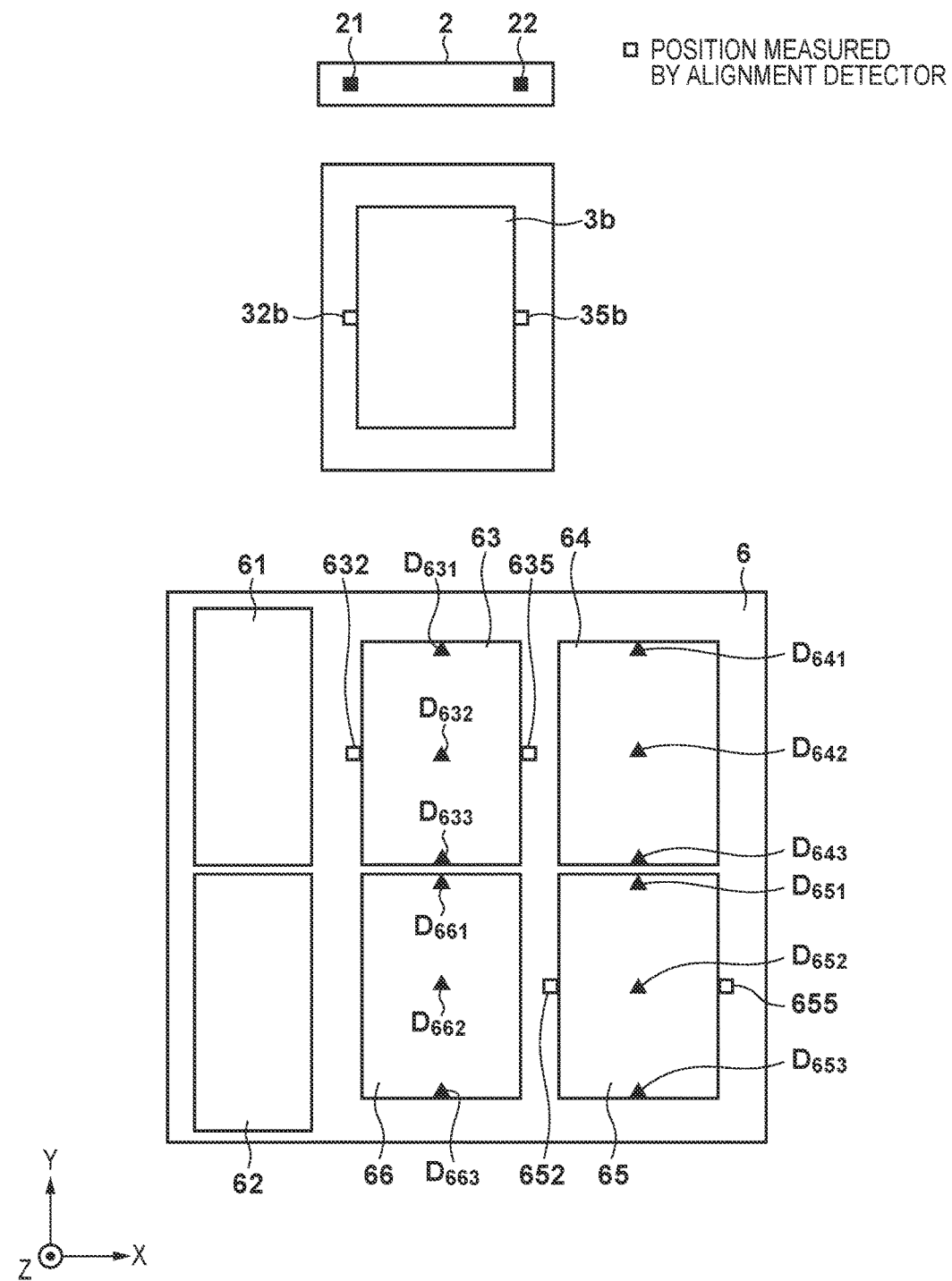
FIG. 10 shows views of examples of the arrangement of the alignment detector of the second exposure apparatus, and the measurement marks arranged on the original and substrate.

A modification of exposure processing by the second exposure apparatus 100b will be described with reference to FIGS. 9 and 10. FIG. 9 is a flowchart showing an exposure method by the second exposure apparatus 100b. FIG. 10 shows views of examples of the arrangement of the alignment detector 2 in the second exposure apparatus 100b, and measurement marks arranged on the second original 3b and substrate 6. Comparing FIG. 9 with the flowchart in FIG. 7, steps S308, S309, and S310 in FIG. 9 are processes which are not shown in FIG. 7.

In step S301, the controller 9 of the second exposure apparatus 100b controls the second conveying device 11b to extract the substrate 6 processed by the first exposure apparatus 100a from the substrate stocker 12, load the substrate 6 to the substrate stage 7 of the second exposure apparatus 100b, and mount the substrate 6 on the substrate stage 7.

In step S302, the controller 9 controls the substrate stage 7 and the original stage 4 so that the substrate-side marks 632 and 635 of the shot region 63, and the original-side marks 32b and 35b to be measured are detected by the alignment detectors 21 and 22.

In step S303, the controller 9 causes the alignment detectors 21 and 22 to detect the marks, and obtains the positions of the substrate-side marks 632 and 635 with respect to the second original 3b. Let ($Ax_{632}$, $Ay_{632}$) and ($Ax_{635}$, $Ay_{635}$) be the results.

In step S304, the controller 9 reads out results measured by the first exposure apparatus 100a (measurement results stored in step S110) from the buffer device 10. Let ($Ox_{6ij}$, $Oy_{6ij}$) (i=3 to 6, and j=1 to 6) be the readout results.

In step S308, the controller 9 controls the substrate stage 7 and the original stage 4 so that the substrate-side marks 652 and 655 of the shot region 65, and the original-side marks 32b and 35b to be measured are detected by the alignment detectors 21 and 22 shown in FIG. 10.

In step S309, the controller 9 causes the alignment detectors 21 and 22 to detect the marks, and obtains the positions of the substrate-side marks with respect to the second original 3b. Let ($Ax_{652}$, $Ay_{652}$) and ($Ax_{655}$, $Ay_{655}$) be results.

In step S310, the controller 9 calculates a correction amount at the time of exposure. The correction amount is calculated as follows. For example, based on measurement results (steps S303 and S309) of the substrate-side marks 632, 635, 652, and 655 shown in FIG. 10 and the measurement results read out in step S304, the controller 9 obtains the positions of the substrate-side marks with respect to the second original 3b. Note that, for example, owing to a temperature change of the substrate 6, the current magnification of the substrate 6 may be changed from the magnification of the substrate 6 measured in advance. Therefore, based on the results (steps S303, S309, and S304) obtained by measuring the substrate-side marks shown in FIG. 10, the controller 9 obtains the change in substrate magnification. Letting ($MagX_{6ij}$, $MagY_{6ij}$) be a change in substrate magnification, the change in substrate magnification is obtained by:

$$MagX_{6ik} = ((Ax_{652}+Ax_{655})/((Ox_{652}-Ax_{632}-Ox_{632})+(Ox_{655}+Ax_{635}-Ox_{635}) \cdot Dx_{6ik}/Dx_{652} \quad (25)$$

$$MagY_{6ik} = ((Ay_{652}+Ay_{655})/((Oy_{652}-Ay_{632}-Oy_{632})+(Oy_{655}+Ay_{635}-Oy_{635}) \cdot Dy_{6ik}/Dy_{652} \quad (26)$$

Note that let ($Dx_{6ik}$, $Dy_{6ik}$) (i=3 to 6, and k=1 to 3) be a signed distance from the central position of two measurement marks in the measurement shot 63 in step S303 to the central position of two measurement marks in each shot.

The controller 9 calculates the positions of the substrate-side marks with respect to the second original 3b based on equations (25) and (26). Letting ($x_{6ij}$, $y_{6ij}$) be the positions of the substrate-side marks with respect to the second original 3b, the positions of the substrate-side marks with respect to the second original 3b with the change in substrate magnification being corrected are obtained by:

when j≤3, $$(x_{6ij}, y_{6ij}) = (Ox_{6ij}+Ax_{632}-Ox_{632}) \cdot MagX_{6ij}, (Oy_{6ij}+Ay_{632}-Oy_{632}) \cdot MagY_{6ij}) \quad (27)$$

when j>3, $$(x_{6ij}, y_{6ij}) = ((Ox_{6ij}+Ax_{635}-Ox_{635}) \cdot MagX_{6ij(j-3)}, (Oy_{6ij}+Ay_{635}-Oy_{635}) \cdot MagY_{6ij(j-3)}) \quad (28)$$

Based on values obtained by equations (27) and (28), the controller 9 obtains shot correction components shown in FIG. 6. The subsequent calculation is performed in the same manner as equations (3) to (22) in step S111, obtaining the driving amounts ($X_{comp}$, $Y_{comp}$, $\theta_{comp}$) of the substrate stage 7 and the driving amount $O_{comp}$ of the optical element.

In step S306, based on the driving amounts ($X_{comp}$, $Y_{comp}$, $\theta_{comp}$) of the substrate stage 7 and the driving amount $O_{comp}$ of the optical element obtained in step S310, the controller 9 performs scan exposure by synchronizing the original stage 4 and the substrate stage 7 with each other.

In step S307, the controller 9 confirms whether all the shot regions 63, 64, 65, and 66 to be processed by the second exposure apparatus 100b have been exposed. If there is an unexposed shot, the controller 9 performs steps S310 and S306 repeatedly for the unexposed shot.

As described above, according to this modification, the second exposure apparatus 100b measures the marks of the shot regions processed by this second exposure apparatus 100b at two points at a minimum. Therefore, it becomes possible to calculate the current magnification of the substrate 6 and to correct the magnification change of the substrate 6 from positional results of the substrate-side marks measured in advance. This makes it possible to prevent a decrease in overlay accuracy caused by partially omitting measurement of the marks in the shot regions processed by the second exposure apparatus 100b.

<Embodiment of Article Manufacturing Method>

An article manufacturing method according to an embodiment of the present invention suitably manufactures an article, for example, a microdevice such as a semiconductor device or an element having a microstructure. The article manufacturing method of this embodiment includes a step of forming a latent pattern by using the above-described patterning method or lithography apparatus on a photosensitive agent applied on a substrate (a step of exposing the substrate), and a step of processing (developing) the substrate on which the latent pattern has been formed in the above step. In addition, the manufacturing method includes other well-known steps (for example, oxidation, film formation, deposition, doping, planarization, etching, resist removal, dicing, bonding, and packaging). The article manufacturing method of this embodiment is more advantageous than the conventional methods in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-169606, filed Sep. 4, 2017, which is hereby incorporated by reference herein in its entirety.

What is claimed is:

1. A patterning method of forming a pattern of an original on a substrate using a lithography apparatus, the method comprising:

detecting a plurality of first substrate-side marks arranged with respect to, out of a plurality of shot regions of the substrate, a part of shot regions on which the pattern is to be formed using a first original in the lithography apparatus;

detecting a plurality of second substrate-side marks arranged with respect to, out of the plurality of shot regions, other shot regions different from the part of the shot regions, on which the pattern is to be formed using a second original different from the first original in another lithography apparatus;

outputting information on detection results of the plurality of second substrate-side marks to be available in the another lithography apparatus; and forming the pattern while performing alignment with the first original with respect to the part of the shot regions, based on detection results of the plurality of first substrate-side marks.

2. The method according to claim 1, wherein:

the lithography apparatus includes:

an alignment detector configured to detect, via the first original, one of the plurality of first substrate-side marks and an original-side mark formed on the first original; and an off-axis detector configured to detect one of the plurality of first substrate-side marks without going through the first original, the detecting of the plurality of first substrate-side marks includes:

detecting a reference mark out of the plurality of first substrate-side marks and the original-side mark using the alignment detector; and detecting the plurality of first substrate-side marks using the off-axis detector, and the performing alignment includes calculating, based on a deviation amount of the reference mark with respect to the original-side mark obtained from a detection result by the alignment detector, a correction amount of positions of the plurality of first substrate-side marks detected by the off-axis detector.

3. A patterning method of forming a pattern of an original on a substrate using a lithography apparatus, the method comprising:

detecting, with the lithography apparatus, a reference mark out of a plurality of substrate-side marks arranged with respect to, out of a plurality of shot regions of the substrate, a part of shot regions on which the pattern is not formed by another lithography apparatus and is to be formed by the lithography apparatus;

obtaining information on detection results of the plurality of substrate-side marks by the another lithography apparatus; and based on a detection result in the detecting of the reference mark and the information obtained in the obtaining of the information, forming the pattern while performing alignment with the original with respect to some of the shot regions.

4. The method according to claim 3, wherein:
the plurality of substrate-side marks include a plurality of reference marks, and
the performing alignment includes obtaining a magnification change of the substrate based on detection results of the plurality of reference marks.

5. A patterning method of forming a pattern of a first original and a pattern of a second original different from the first original on a substrate using a plurality of lithography apparatuses that include a first lithography apparatus and a second lithography apparatus, the method comprising:
in the first lithography apparatus:
detecting a plurality of first substrate-side marks arranged with respect to, out of a plurality of shot regions of the substrate, a part of shot regions, on which the pattern is to be formed using the first original in the first lithography apparatus;
detecting a plurality of second substrate-side marks arranged with respect to, out of the plurality of shot regions, other shot regions different from the part of the shot regions on which the pattern is to be formed using the second original in the second lithography apparatus;
outputting information on detection results of the plurality of second substrate-side marks to be available in the second lithography apparatus; and
based on detection results of the plurality of first substrate-side marks, forming the pattern while performing alignment with the first original with respect to the part of the shot regions, and
in the second lithography apparatus:
detecting a reference mark out of the plurality of second substrate-side marks;
obtaining information on detection results of the plurality of second marks output from the first lithography apparatus; and
based on a detection result in the detecting of the reference mark and the information obtained in the obtaining of the information, forming the pattern while performing alignment with the second original with respect to the other shot regions.

6. The method according to claim 5, wherein out of the plurality of lithography apparatuses, a specific lithography apparatus that functions as the first lithography apparatus, and another specific lithography apparatus that functions as the second lithography apparatus are designated in a recipe for the patterning.

7. A lithography apparatus for forming a pattern of an original on a substrate, the apparatus comprising:
a detector configured to detect marks arranged with respect to a plurality of shot regions of the substrate; and
a controller configured to control, based on detection results in the detector, forming of the pattern, and alignment between the shot regions and the original, wherein the controller:
controls the detector to detect a plurality of first substrate-side marks arranged with respect to, out of the plurality of shot regions, a part of shot regions on which the pattern is to be formed using a first original in the lithography apparatus and detect a plurality of second substrate-side marks arranged with respect to, out of the plurality of shot regions, other shot regions different from the part of the shot regions, on which the pattern is to be formed using a second original different from the first original in another lithography apparatus;
outputs information on detection results of the plurality of second substrate-side marks to be available in the another lithography apparatus; and
based on detection results of the plurality of first substrate-side marks, controls forming of the pattern while performing alignment with the first original with respect to the part of the shot regions.

8. The apparatus according to claim 7, wherein the lithography apparatus is an exposure apparatus that transfers the pattern of the original to the substrate via a projection optical system.

9. The apparatus according to claim 7, wherein the lithography apparatus is an imprint apparatus forming the pattern on an imprint material on the substrate using a mold.

10. A lithography apparatus for forming a pattern of an original on a substrate, the apparatus comprising:
a detector configured to detect marks arranged with respect to a plurality of shot regions of the substrate; and
a controller configured to control, based on detection results in the detector, forming of the pattern, and alignment between the shot regions and the original, wherein the controller:
detects a reference mark out of a plurality of substrate-side marks arranged with respect to, out of the plurality of shot regions, a part of shot regions on which the pattern is not formed by another lithography apparatus and is to be formed in the lithography apparatus;
obtains information on detection results of the plurality of substrate-side marks in another lithography apparatus; and
based on the detection results of the plurality of substrate-side marks and the obtained information, forms the pattern while performing alignment with the original with respect to the part of the shot regions.

11. An article manufacturing method of manufacturing an article, the method comprising:
forming a pattern on a substrate using a patterning method of forming a pattern of a first original and a pattern of a second original different from the first original on the substrate using a plurality of lithography apparatuses that include a first lithography apparatus and a second lithography apparatus; and
processing the substrate on which the pattern has been formed,
wherein the article is manufactured from the processed substrate,
wherein the pattering method comprises:
in the first lithography apparatus:
detecting a plurality of first substrate-side marks arranged with respect to, out of a plurality of shot regions of the substrate, a part of shot regions on which the pattern is to be formed using the first original in the first lithography apparatus;
detecting a plurality of second substrate-side marks arranged with respect to, out of the plurality of shot regions, other shot regions different from the part of the shot regions on which the pattern is to be formed using the second original in the second lithography apparatus;

outputting information on detection results of the plurality of second substrate-side marks to be available in the second lithography apparatus; and based on detection results of the plurality of first substrate-side marks, forming the pattern while performing alignment with the first original with respect to the part of the shot regions, and in the second lithography apparatus:

detecting a reference mark out of the plurality of second substrate-side marks;

obtaining information on detection results of the plurality of second marks output from the first lithography apparatus; and based on a detection result in the detecting of the reference mark and the information obtained in the obtaining of the information, forming the pattern while performing alignment with the second original with respect to the other shot regions.

* * * * *